United States Patent [19]

Hartman et al.

[11] 4,323,942
[45] * Apr. 6, 1982

[54] SOLID-STATE PROTECTOR CIRCUITRY USING GATED DIODE SWITCH

[75] Inventors: Adrian R. Hartman; Robert S. Scott, both of New Providence; Peter W. Shackle, Bridgewater, all of N.J.

[73] Assignee: Bell Telephone Laboratories, Incorporated, Murray Hill, N.J.

[*] Notice: The portion of the term of this patent subsequent to Jun. 2, 1998, has been disclaimed.

[21] Appl. No.: 120,283

[22] Filed: Feb. 11, 1980

Related U.S. Application Data

[63] Continuation-in-part of Ser. No. 972,055, Dec. 20, 1978, Pat. No. 4,271,445.

[51] Int. Cl.³ .............................................. H02H 3/20
[52] U.S. Cl. ........................................ 361/56; 361/91; 361/111; 307/252 R; 307/252 C; 307/252 T

[58] Field of Search .................. 361/56, 91, 111, 110, 361/54, 55, 88, 89, 18, 90, 198; 307/252 F, 252 T, 252 R, 252 K, 252 J, 252 A, 252 D, 301, 302, 299 R; 323/231

[56] References Cited

U.S. PATENT DOCUMENTS

| | | | |
|---|---|---|---|
| 3,475,653 | 10/1969 | Odenberg et al. | 307/252 T |
| 3,573,550 | 4/1971 | Baker, Jr. | 361/56 |
| 3,904,892 | 9/1975 | Leonard | 307/252 F |

OTHER PUBLICATIONS

"The D13T-A Programmable Unijunction Transistor", by Spofford, Jr., General Elect. Application Engineering-90.70-date 11/1967, p. 9, Fig. 16.

*Primary Examiner*—Patrick R. Salce
*Attorney, Agent, or Firm*—Irwin Ostroff

[57] ABSTRACT

A solid-state protector circuit utilizes the combination of two zener diodes (Z1, Z2), a resistor (R1), a capacitor (C1), and a gated diode switch (GDS) to facilitate the rapid discharge of high voltage transients.

7 Claims, 3 Drawing Figures

SOLID-STATE PROTECTOR CIRCUITRY USING GATED DIODE SWITCH

CROSS-REFERENCE TO RELATED APPLICATION

This application is a continuation-in-part of our co-pending application, Ser. No. 972,055, filed Dec. 20, 1978; now U.S. Pat. No. 4,271,445.

TECHNICAL FIELD

This invention relates to protection circuitry and, more particularly, to solid-state voltage overload protection circuitry.

BACKGROUND OF THE INVENTION

Zener diodes are commonly used as voltage clamps to provide voltage overload protection. As the magnitude of the voltage and current overload levels to be controlled increases, the size and cost of a zener diode increases commensurately. The cost of zener diodes to afford overload protection from voltage surges of hundreds of volts and tens of amperes usually makes such zener diodes economically nonviable.

For high voltage operation, TRIACs are commonly used. TRIAC voltage overload protectors require a high holding current which is difficult to achieve. In addition, TRIACs are sensitive to dv/dt changes and can be turned on by a relatively small voltage change which occurs in a very short period of time. It is desired that a protection device only turn on if the magnitude of the voltage overload reaches a preselected level.

It is desirable to have solid-state protector circuitry which can relatively rapidly discharge voltage surges of hundreds of volts and at least several amperes when the magnitude of the voltage overload reaches a selected potential and which is relatively insensitive to dv/dt changes.

There have recently become available new forms of solid-state switches which can be operated at high voltages and at high currents. Switches of this kind are disclosed in U.S. patent applications Ser. Nos. 972,056 (A. R. Hartman-T. J. Riley-P. W. Shackle), 971,886 (A. R. Hartman-B. T. Murphy-T. J. Riley-P. W. Shackle), and 972,021 (A. R. Hartman-A. U. MacRae-P. W. Shackle), and in the article entitled "A Field Terminated Diode" by Douglas E. Houston et al, published in *IEEE Transactions on Electron Devices*, Vol. ED-23, No. 8, August 1976.

SUMMARY OF THE INVENTION

The present invention involves the use of such solid-state switches in novel circuitry to achieve overload protection circuitry capable of high voltage and high current operation. In one embodiment, such a switch is interconnected with pair of zener diodes or functionally equivalent devices, of relatively low power capabilities, and a resistor element. In particular, an illustrative circuit includes a gated diode switch having a first zener diode connected between its anode and one circuit terminal and a second zener diode connected between its gate and other circuit terminal. The gate of the GDS is also connected by way of a resistor to the first circuit terminal and the cathode of the GDS is connected to the second circuit terminal.

These and other features and advantages of the present invention are better understood from consideration of the following detailed description taken in conjunction with the accompanying drawing.

DETAILED DESCRIPTION

Figure 1:
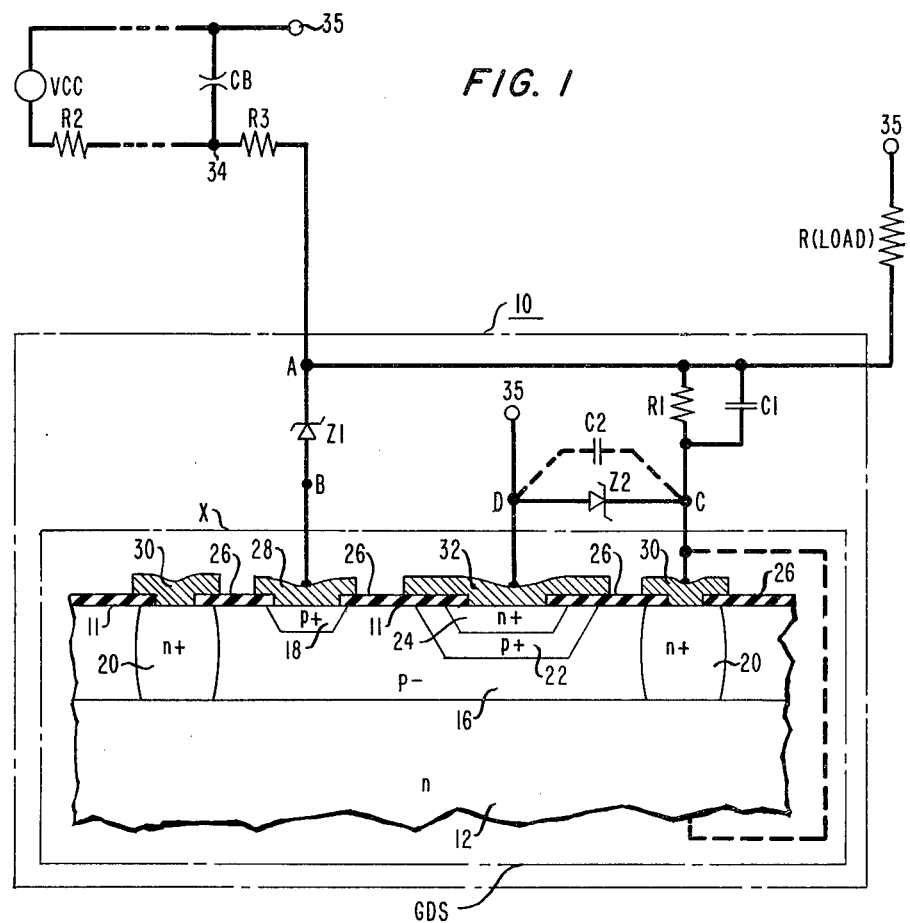
FIGS. 1 and 2 illustrate an embodiment in accordance with the present invention.
Figure 2:
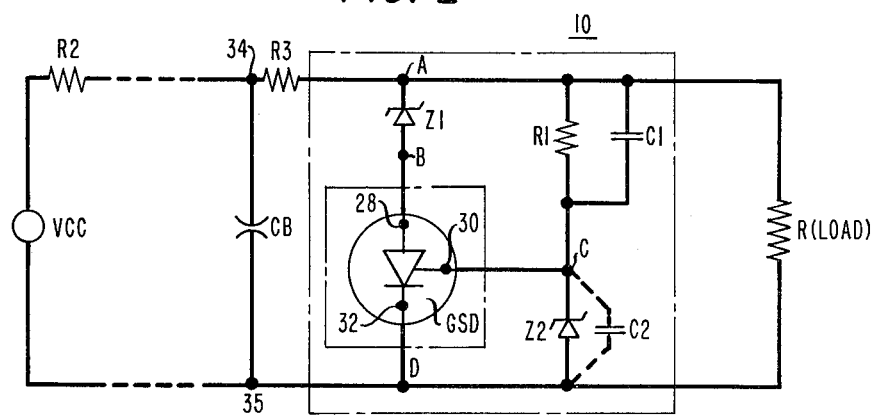

Referring now to FIGS. 1 and 2, there is illustrated within a dashed line rectangle protector circuitry 10 comprising zener diodes Z1 and Z2, a capacitor C1, the parasitic capacitance C2 (illustrated with dashed lines) associated with Z2, a resistor R1, and a gated diode switch (GDS) (within dashed line rectangle X). The gated diode switch, which is illustrated in semiconductor cross section in FIG. 1, is by way of example of the kind disclosed and described in U.S. patent application Ser. No. 971,886 (A. R. Hartman et al). FIG. 2 is the same as FIG. 1 except that a proposed electrical symbol for the GDS is illustrated instead of the semiconductor cross section.

Protector circuitry 10 is illustrated connected to a load element R(Load) and is coupled to a voltage supply VCC through battery feed resistor R2 and current limiting resistor R3. A carbon block CB is illustrated connected to a common terminal 34 of R2 and R3 and to a terminal 35 which is the return terminal of VCC. The break illustrated between R2 and R3 is meant to represent telephone or other similar lines. These lines are generally outdoors and as such are subject to being struck by lightning. CB serves to greatly attenuate the magnitude of the voltage surge caused by a lightning strike on these lines. Protector circuitry 10 serves to dissipate the remaining high voltage transient and thus to limit damage to R(Load).

A first terminal of each of R1, R(Load), C1, and the cathode of Z1 is coupled to a terminal A. A second terminal of each of R1 and of C1 is coupled to the cathode of Z2 and to the GDS at gate electrode 30 and to terminal C. The dashed line between terminal C and semiconductor wafer (substrate) 12 illustrates that terminal C can be connected to semiconductor wafer (substrate) 12 directly instead of being coupled thereto through electrode 30 and region 20. The anode of Z2 is coupled to the cathode electrode 32 of the GDS, to a terminal D, and to a terminal 35. The anode of Z1 is coupled to anode electrode 28 of the GDS and to a terminal B. Semiconductor regions 18 and 24, and semiconductor wafer 12 (and region 20) serve as the anode, cathode, and gate, respectively, of the GDS. Electrodes 28, 30, 32 are typically aluminum and make low resistance contact to anode region 18, region 20 and wafer 12 (the gate of the GDS), and cathode region 24, respectively. Typical conductivity types for each region are illustrated in the drawing.

The basic operation of the GDS in the ON state is such that there is dual injection of charge carriers between regions 18 and 24 if gate region 12 is of a less positive potential than anode region 18. If the potential of the gate (wafer 12 and region 20) is made more positive than that of anode region 18 and cathode region 24 by a preselected amount, then conduction through the GDS between anode and cathode is cut off or inhibited and the GDS is in the OFF state. Layer 26 is typically $SiO_2$ and the planar surface of the GDS is denoted by the numerical reference 11.

In one typical embodiment, VCC=+48 volts, terminal 35 is held at 0 volts, R1=100 ohms, R2=400 ohms, R3=100 ohms, R(Load)=500 ohms, and C1=1000 pF, C2=30 pF, and VBD (Breakdown Voltage) of Z1=20 volts, VBD (Breakdown Voltage) of Z2=200 volts. With these conditions terminal A is at approximately 25 volts, terminal B is at approximately +5 volts, and terminal C is at approximately +25 volts. With terminal C (the gate of the GDS) at a more positive potential than terminal B (the anode of the GDS) the GDS is biased to the OFF state and there is no conduction between terminals B and D.

Substrate 12 and cathode region 24 of the GDS act as collector and emitter of a vertical n-p-n transistor in which body 16 and region 22 form the base. If the GDS is in the ON state there is conduction between anode region 18 and cathode region 24. This conduction serves as a source of base current such that conduction between substrate 12 and cathode region 24 occurs. If conduction between regions 18 and 24 is cut off, then the supply of base current which supports conduction between substrate 12 and cathode region 24 is cut off. Accordingly, conduction between substrate 12 and cathode region 24 is cut off.

When lightning strikes the electrical lines between R2 and R3, CB attenuates the resulting surge voltage to typically a thousand volts or less. R3 serves to limit the current transient. If the potential of terminal A increases by 220 volts to +245 volts, then Z2 operates in avalanche breakdown and limits the potential of terminal C to approximately +200 volts. Terminal B rises in potential from +5 volts to +225 volts. Terminal B thus becomes more positive in potential than terminal C. Accordingly, the GDS is biased to the ON state and conduction between terminals B (anode region 18) and D (cathode region 24) is initiated. Typically, the voltage drop across terminals B and D with the GDS conducting one ampere is on the order of two or three volts. Since Z1 has a breakdown potential of 20 volts, it operates in avalanche breakdown and terminal A is held in potential at approximately 22–23 volts above VSS. The current flow from anode region 18 to cathode region 24 serves as base current which supports conduction from terminal A, through R1, into substrate 12, out of cathode region 24, and into terminal 35.

Most of the current transient associated with the lightning strike rapidly discharges through Z1 and the anode-cathode of the GDS. As the lightning caused current dissipates the current flow through R1 decreases to a point at which the potential of terminal C increases to a potential value sufficiently more positive than that of terminal B to switch the GDS from the ON to the OFF state. This allows terminal A to return in potential to the initial level of +25 volts which existed prior to the lightning strike.

The use of capacitor C1 serves to prevent protector circuitry 10 from conducting in response to a fast voltage change at terminal A in which the magnitude of the voltage change is less than a preselected value. Without C1, a 100-volt voltage spike applied to terminal A could raise the potential of terminal B to a more positive potential than that of terminal C and thereby activate conduction through the GDS. C1 provides a low impedance alternating current path from terminal A to terminal C which allows terminal C to quickly follow fast voltage changes applied to terminal A. This keeps terminal C at a higher potential than terminal B and thus keeps the GDS from conducting until the magnitude of the voltage change at terminal A is above the preselected value. With C1=1000 pF and C2=approximately 30 pF, it was found that protector circuitry 10 was not triggered even by a 100-volt pulse applied in one microsecond. Thus, the dv/dt sensitivity is high and protector circuitry 10 will not trigger until the magnitude of the voltage reaches the preselected level.

Figure 3:
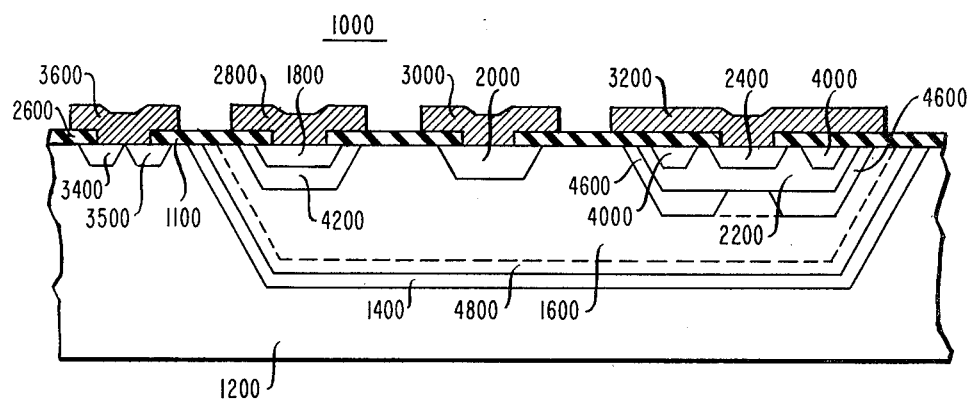
FIG. 3 illustrates an embodiment of a semiconductor structure.

The GDS actually used as part of the circuitry of the present invention is one of two essentially identical GDSs that were fabricated on a single n type substrate having a thickness of 18 to 22 mils and a conductivity of $10^{15}$ to $10^{16}$ impurities/cm$^3$. This two GDS structure is illustrated in FIG. 3 of U.S. patent application Ser. No. 971,886 (A. R. Hartman et al Case 8-20-6-6). Body 16 is of p− type conductivity with a thickness of 30 to 40 microns, a width of 720 microns, a length of 910 microns, and an impurity concentration in the range of $5-9\times10^{13}$ impurities/cm$^3$. Anode region 18 is a curved region of p+ type conductivity with a thickness of 2 to 4 microns, and an impurity concentration of $10^{19}$ impurities/cm$^3$. Cathode region 24 is a curved region of n+ type conductivity with a thickness of 2 to 4 microns, and an impurity concentration of $10^{19}$ impurities/cm$^3$. Region 22 is a curved region of p− type conductivity with a thickness of 4–6 microns and an impurity concentration of $10^{18}$ impurities/cm$^3$. The spacing between anode region 18 and region 22 is typically 120 microns. The overall length and width of the two GSDs is 1910 microns by 1300 microns.

Referring now to FIG. 3, there is illustrated a structure 1000 which can be substituted for the GDS of FIGS. 1 and 2. Structure 1000 is illustrated and described in U.S. patent application Ser. No. 107,774 (A. R. Hartman-T J. Riley-P. W. Shackle Case 18-13-21) which was filed Dec. 28, 1979, and is a continuation-in-part of Ser. No. 972,056, (A. R. Hartman-T. J. Riley-P. W. Shackle Case 6-5-4), filed Dec. 20, 1978.

Switch structure 1000 comprising a support member 1200 having a major surface 1100 and a monocrystalline semiconductor body 1600 whose bulk is of relatively high resistivity and which is separated from support member 1200 by a dielectric layer 1400.

A localized anode region 1800, which is of p+ type conductivity, is included in body 1600 and has a portion thereof that extends to surface 1100. A p type region 4200 surrounds anode region 1800. A localized gate region 2000, which is of n+ type conductivity, and a localized cathode region 2400, which is of n+ type conductivity, are also included in body 1600. A region 2200, which is of the p type conductivity and has a portion which extends to surface 1100, encircles cathode 2400 and acts as a depletion layer punch-through shield. A p+ type conductivity guard ring region 4000 encircles cathode region 2400 and is itself encircled by region 2200. A region 4600, which is of p− type conductivity, surrounds region 2200. As is indicated by the dashed line between portions of region 4600, region 4600 can completely surround a bottom portion of region 2200. Region 4000 acts to inhibit inversion of the portions of body 1600 at or near surface 1100 between regions 2000 and 2400. Gate region 2000 is located between anode region 1800 and region 2200 and is separated from both by bulk portions of body 1600. The resistivities of regions 1800, 2000, and 2400 are low compared to that of the bulk portions of body 1600. The resistivity of region 2200 is intermediate that of cathode region 2400 and that of the bulk portion of body 1600. The resistivity of region 4600 is intermediate between that of region 2200 and the bulk portion of semiconductor body 1600. The resistivity of region 4000 is essentially the same as anode region 1800. Region 4800 is sandwiched between body 1600 and dielectric layer 1400. Region 4800, which is optional, is of n− type conductivity.

Electrodes 2800, 3000, and 3200 are conductors which make low resistance contact to the surface portions 1100 of regions 1800, 2000, and 2400, respectively. A dielectric layer 2600 covers major surface 1100 so as to isolate electrodes 2800, 3000, and 3200 from all regions other than those intended to be electrically contacted. An electrode 3600 provides a low resistance contact to support 1200 by way of highly doped regions 3400 and 3500 which are of n+ type and p+ type conductivity, respectively. This allows for low resistance contact to support 1200 independent of the conductivity type thereof.

Advantageously, the support 1200 and the body 1600 are each of silicon with the support 1200 being either of n or p type conductivity. Each of electrodes 2800, 3000, and 3200 advantageously overlaps the semiconductor region to which it makes low resistance contact. Electrode 3200 also overlaps region 2200. This overlapping, which is known as field plating, facilitates high voltage operation because it increases the voltage at which breakdown occurs.

A plurality of separate bodies 1600 can be formed in a common support 1200 to provide a plurality of switches.

Structure 1000 is typically operated as a switch which is characterized by a low impedance path between anode region 1800 and cathode region 2400 when in the ON (conducting) state and as a high impedance between said two regions when in the OFF (blocking) state. With proper operating potentials applied to anode region 1800 and cathode region 2400, the potential applied to gate region 2000 determines the state of the switch. Conduction between anode region 1800 and cathode region 2400 occurs if the potential of gate region 2000 is below that of the potential of anode region 1800, cathode region 2400, and shield region 2200. During the ON state holes are injected into body 1600 from anode region 1800 and electrons are injected into body 1600 from cathode region 2400. The ON state can be achieved by applying proper operating potentials to the anode and cathode regions and forward-biasing the anode region with respect to the gate region. These holes and electrons exist in sufficient numbers to form a plasma which conductivity modulates body 1600. This effectively lowers the resistance of body 1600 such that the resistance between anode region 1800 and cathode region 2400 is relatively low when structure 1000 is operating in the ON state. This type of operation is denoted as dual carrier injection.

Region 2200 helps limit the punch-through of a depletion layer formed during operation between gate region 2000 and cathode region 2400 and helps inhibit formation of a surface inversion layer between these two regions. In addition, it facilitates gate region 2000 and cathode region 2400 being relatively closely spaced apart. This facilitates relatively low resistance between anode region 18 and cathode region 24 during the ON state.

Support 1200 is typically held at the most positive potential level available. During the OFF state conduction between anode region 1800 and cathode region 2400 is inhibited or cut off if the potential of gate region 2000 is sufficiently more positive than that of anode region 1800, cathode region 2400, and region 2200. The amount of excess positive potential needed to inhibit or cut off conduction is a function of the geometry and impurity concentration (doping) levels of structure 1000. This positive gate potential causes the portion of body 1600 between gate region 2000 and the dielectric layer 1400 to be more positive in potential than anode region 1800, cathode region 2400, and/or region 2200. This positive potential barrier inhibits the conduction of holes from region 1800 to cathode region 2400.

With the semiconductor body 1600 and anode region 1800 both being of p type conductivity, the structure 1000 is one of the basic structures disclosed and described in copending U.S. patent application Ser. No. 972,056, filed Dec. 20, 1978, and in which there is a common assignee. In this structure, which is denoted as a gated diode switch (GDS) in the aforesaid copending application, the positive gate voltage causes a cross-sectional portion of semiconductor body between the gate region and the dielectric layer therebelow to be essentially depleted as well as the potential thereof being greater than that of anode, cathode, and shield region. The positive potential of this cross-sectional portion of semiconductor body inhibits the conduction of holes from the anode region to the cathode region and serves to collect electrons emitted at the cathode region before they can reach the anode region.

With the semiconductor body 16 being of n type conductivity, and region 1800 being of p type conductivity the structure 1000 is the structure disclosed and described in U.S. patent application Ser. No. 107,775 (A. R. Hartman-T. J. Riley-P. W. Shackle), filed Dec. 28, 1979, and which has a common assignee with this application. In this structure the positive gate potential causes depletion regions to form at the junction of the anode region and semiconductor body and at the junction of the shield region and semiconductor body. In addition this causes a vertical cross-sectional portion of the semiconductor body between the anode and cathode regions to be more positive in potential than the anode, cathode, and/or shield regions. The positive potential of this cross-sectional portion of semiconductor body inhibits conduction of holes from the anode region to the cathode region and serves to collect electrons emitted at cathode region before they can reach anode region.

All of the above-disclosed structures are high voltage switches that have separate anode, cathode, and gate regions, are characterized by dual carrier conduction, and are controlled in similar manners.

The embodiments described herein are intended to be illustrative of the general principles of the present invention. Various modifications are possible consistent with the spirit of the invention. For example, GDSs other than the one illustrated could be substituted. Voltage polarities would have to be adjusted to different GDS structures. Still further, zener diodes could be replaced with other devices which perform a similar function. Similarly, the resistor (R1) can take any of the forms known to provide a suitable resistance and current carrying capacity.

We claim:
1. Circuitry comprising:
a first device having first and second terminals and having the characteristic that there is substantially no conduction therethrough in one direction until a threshold voltage is reached and thereafter the volt- age across the device stays essentially constant for increasing conduction therethrough;

a second device having first and second terminals and characteristics similar to the first device;

a switch having first output, second output, and control terminals;

a resistor having first and second terminals with the first terminal being coupled to the second terminal of the first device and the second terminal of the resistor being coupled to the control terminal of the switch and to the second terminal of the second device;

the first terminal of the first device is connected to the first output terminal of the switch;

the first terminal of the second device being coupled to the second output terminal of the switch;

the switch being a device of the type comprising a semiconductor body a bulk portion of which is of a relatively high resistivity, a first region of a first conductivity type and of a relatively low resistivity, a second region of a second conductivity type opposite that of the first conductivity type, the first and second regions being connected to first and second output terminals, respectively, of the switching device, a gate region of the second conductivity type being connected to the control terminal of the switching device, the first, second, and gate regions being mutually separated by portions of the semiconductor body bulk portion.

2. Circuitry comprising:

a first device having first and second terminals and having the characteristic that there is substantially no conduction therethrough in one direction until a threshold voltage is reached and thereafter the voltage across the device stays essentially constant for increasing conduction therethrough;

a second device having first and second terminals and characteristics similar to the first device;

a switch having first output, second output, and control terminals;

a resistor having first and second terminals with the first terminal being coupled to the second terminal of the first device and the second terminal of the resistor being coupled to the control terminal of the switch and to the second terminal of the second device;

the first terminal of the first device is connected to the first output terminal of the switch;

the first terminal of the second device being coupled to the second output terminal of the switch; and the switch being a device of the type comprising a semiconductor body a bulk portion of which is of a relatively high resistivity, a first region of a first conductivity type and of a relatively low resistivity, a second region of a second conductivity type opposite that of the first conductivity type, the first and second regions being connected to output terminals of the switching device, a gate region of the second conductivity type, the first, second and gate regions being mutually separated by portions of the semiconductor body bulk portion, the parameters of the device being such that, with a first voltage applied to the gate region, a potential is established within a cross-sectional portion of the bulk of the semiconductor body which is substantially different from that of the potential of the first and second regions and which prevents current flow between the first and second regions, and that, with a second voltage applied to the first and second regions, a relatively low resistance current path is established between the first and second regions by dual carrier injection.

3. Circuitry comprising:

a first device having first and second terminals and having the characteristic that there is substantially no conduction therethrough in one direction until a threshold voltage is reached and thereafter the voltage across the device stays essentially constant for increasing conduction therethrough;

a second device having first and second terminals and characteristics similar to the first device;

a switch having first output, second output, and control terminals;

a resistor having first and second terminals with the first terminal being coupled to the second terminal of the first device and the second terminal of the resistor being coupled to the control terminal of the switch and to the second terminal of the second device;

the first terminal of the first device is connected to the first output terminal of the switch;

the first terminal of the second device being coupled to the second output terminal of the switch;

the switch comprising:

a semiconductor body whose bulk is of one conductivity type and which has a major surface;

a localized first region which is of the one conductivity type, and a localized second region and a localized third region which are both of the opposite conductivity type;

each of the localized first, second, and third regions being of relatively low resistivity as compared to the bulk portion of the semiconductor body and being spaced apart from each other;

separate electrodes being connected to each of the first, second and third regions;

the localized first, second, and third regions each have a portion thereof which forms a part of the major surface of the semiconductor body;

the structure being adapted to selectively facilitate current flow between the first and third regions or to divert a sufficient portion of said current into the second region so as to substantially interrupt (cut off) said current flow between the first and third regions; and the structure being also adapted to selectively substantially inhibit current from flowing between the first and third regions.

4. Circuitry comprising:

a first device having first and second terminals and having the characteristic that there is substantially no conduction therethrough in one direction until a threshold voltage is reached and thereafter the voltage across the device stays essentially constant for increasing conduction therethrough;

a second device having first and second terminals and characteristics similar to the first device;

a switch having first output, second output, and control terminals;

a resistor having first and second terminals with the first terminal being coupled to the second terminal of the first device and the second terminal of the resistor being coupled to the control terminal of the switch and to the second terminal of the second device;

the first terminal of the first device is connected to the first output terminal of the switch;

the first terminal of the second device being coupled to the second output terminal of the switch;

the switch comprising a semiconductor body whose bulk is of one conductivity type and relatively high resistivity and which includes anode, gate, and cathode regions spaced apart and localized along a common planar surface of the body, each being of relatively low resistivity, the cathode and gate regions being of the opposite conductivity type as the bulk and the anode region being of the same conductivity type as the bulk, and separate cathode, anode, and gate electrodes, the parameters of the various portions of the switching element being such that with the anode region being forward biased with respect to the cathode region and the potential of the gate region being insufficient to essentially completely deplete a cross-sectional portion of the bulk of the semiconductor body between the anode and cathode regions there is facilitated a substantial current flow between the anode and cathode regions via the bulk, and with the anode region being forward biased with respect to the cathode region and the potential of the gate region being of sufficiently greater magnitude than that of the anode region to essentially completely deplete a cross-sectional portion of the bulk of the semiconductor body between the anode and cathode regions and to cause this portion of the bulk of the semiconductor body to be at a potential which is greater in magnitude than the anode region, there is facilitated an inhibiting or interrupting (cutting off) of current flow between the anode and cathode regions.

5. Circuitry comprising:
a first device having first and second terminals and having the characteristic that there is substantially no conduction therethrough in one direction until a threshold voltage is reached and thereafter the voltage across the device stays essentially constant for increasing conduction therethrough;
a second device having first and second terminals and characteristics similar to the first device;
a switch having first output, second output, and control terminals;
a resistor having first and second terminals with the first terminal being coupled to the second terminal of the first device and the second terminal of the resistor being coupled to the control terminal of the switch and to the second terminal of the second device;
the first terminal of the first device is connected to the first output terminal of the switch;
the first terminal of the second device being coupled to the second output terminal of the switch; and
the switch comprising a semiconductor body whose bulk is of one conductivity type and which has a major surface, a localized first region which is of the one conductivity type, and a localized second region and a localized third region which are both of the opposite conductivity type, each of the localized first, second, and third regions being of relatively low resistivity as compared to the bulk portion of the semiconductor body and being spaced apart from each other, and separate electrodes being connected to each of the first, second, and third regions, the semiconductor body being separated from a semiconductor support member by a dielectric layer, the semiconductor support member having a separate electrode coupled thereto, and the localized first, second, and third regions each have a portion thereof which forms a part of the major surface of the semiconductor body.

6. Circuitry comprising:
a first device having first and second terminals and having the characteristic that there is substantially no conduction therethrough in one direction until a threshold voltage is reached and thereafter the voltage across the device stays essentially constant for increasing conduction therethrough;
a second device having first and second terminals and characteristics similar to the first device;
a switch having first output, second output, and control terminals;
a resistor having first and second terminals with the first terminal being coupled to the second terminal of the first device and the second terminal of the resistor being coupled to the control terminal of the switch and to the second terminal of the second device;
the first terminal of the first device is connected to the first output terminal of the switch;
the first terminal of the second device being coupled to the second output terminal of the switch; and
the switch comprising a semiconductor body whose bulk is of one conductivity type and relatively high resistivity and which includes anode, gate, and cathode regions spaced apart and localized along a common planar surface of the body, each being of relatively low resistivity, the cathode and gate regions being of the opposite conductivity type as the bulk and the anode region being of the same conductivity type as the bulk, and separate cathode, anode, and gate electrodes, the semiconductor body being separated from a semiconductor support member by a dielectric layer, the semiconductor support member having a separate electrode coupled thereto which is adapted to be held at the most positive potential used with the switching element if the gate region is of n+ type conductivity, and at the most negative potential used with the switching element if the gate region is of p+ type conductivity, the parameters of the various portions of the structure being such that with the anode region being forward biased with respect to the cathode region and the potential of the gate region being insufficient to deplete a cross-sectional portion of the bulk of the semiconductor body between the anode and cathode regions there is facilitated a substantial current flow between the anode and cathode regions via the bulk, and with the anode region being forward biased with respect to the cathode region and the potential of the gate region being of a sufficient magnitude relative to the anode region to deplete the portion of the bulk of the semiconductor body between the anode and cathode regions and to cause this portion of the bulk of the semiconductor body to be at a potential which is greater in magnitude than the anode region, there is facilitated an inhibiting or interrupting (cutting off) of current flow between the anode and cathode regions.

7. Circuitry comprising:
a first device having first and second terminals and having the characteristic that there is substantially no conduction therethrough in one direction until a threshold voltage is reached and thereafter the voltage across the device stays essentially constant for increasing conduction therethrough;
a second device having first and second terminals and characteristics similar to the first device;
a switch having first output, second output, and control terminals;
a resistor having first and second terminals with the first terminal being coupled to the second terminal of the first device and the second terminal of the resistor being coupled to the control terminal of the switch and to the second terminal of the second device;

the first terminal of the first device is connected to the first output terminal of the switch;

the first terminal of the second device being coupled to the second output terminal of the switch;

the switch comprising:

a semiconductor body having a bulk portion which is of a first conductivity type;

a first region of the first conductivity type;

second and third regions of a second conductivity type opposite that of the first conductivity type;

the first, second and third regions being mutually separated by portions of the bulk portion;

the resistivities of the first, second and third regions being lower than the resistivity of the bulk portion;

the parameters of the device being such that, with a first voltage applied to the second region, a depletion region and a potential barrier are formed in the semiconductor body which substantially inhibits or substantially interrupts (cuts off) current flow between the first and third regions, and that, with a second voltage applied to the second region and with appropriate voltages applied to the first and third regions, a relatively low resistance current path is established between the first and third regions; and the first, second and third regions each have a portion thereof which is contained on a first major surface of the semiconductor body.

* * * * *